United States Patent
Tsai

(10) Patent No.: US 9,197,033 B1
(45) Date of Patent: Nov. 24, 2015

(54) SOLAR LASER LAMP

(71) Applicant: KE M.O. HOUSE CO., LTD., Shenzhen, Guangdong (CN)

(72) Inventor: Mo-Tsan Tsai, Guangdong (CN)

(73) Assignee: KE M.O. HOUSE CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/640,360

(22) Filed: Mar. 6, 2015

(51) Int. Cl.
| | |
|---|---|
| *H01S 5/00* | (2006.01) |
| *H01S 5/042* | (2006.01) |
| *H01S 5/022* | (2006.01) |
| *H01S 5/40* | (2006.01) |
| *H01S 5/026* | (2006.01) |

(52) U.S. Cl.
CPC ............ *H01S 5/042* (2013.01); *H01S 5/022* (2013.01); *H01S 5/0261* (2013.01); *H01S 5/02248* (2013.01); *H01S 5/02256* (2013.01); *H01S 5/02264* (2013.01); *H01S 5/4025* (2013.01); *H01S 5/4087* (2013.01); *H01S 5/4093* (2013.01)

(58) Field of Classification Search
CPC ... H01S 5/4025; H01S 5/4087; H01S 5/4093; H01S 5/02248; H01S 5/02264; H01S 5/02256; H01S 5/0261
USPC ................ 372/38.04, 50.12, 50.121
See application file for complete search history.

(56) References Cited

U.S. PATENT DOCUMENTS

| | | | | |
|---|---|---|---|---|
| 2009/0185592 A1* | 7/2009 | Vetrovec | ................. | H01S 5/024 372/35 |
| 2011/0069731 A1* | 3/2011 | Gokay | ................. | H01S 5/4018 372/45.01 |

* cited by examiner

*Primary Examiner* — Kinam Park
(74) *Attorney, Agent, or Firm* — Ladas & Parry LLP

(57) ABSTRACT

A solar laser lamp includes: a solar panel assembly, a laser lamp assembly and a ground stud, where the solar panel assembly includes a base, a solar panel, a control circuit board and a storage battery, and the solar panel, the control circuit board and the storage battery are all installed in the base. The laser lamp assembly includes a lamp holder and a laser lamp, and the laser lamp is installed in the lamp holder and is connected to the control circuit board. The ground stud has an installation portion on an upper end, the base has a base connector, the lamp holder has a lamp holder connector, and the base connector, the lamp holder connector and the installation portion are fastened by using a first threaded member to pass therethrough, so that the solar panel assembly and the laser lamp assembly can be integrally installed on the ground stud, to facilitate use, storage and transportation. Moreover, according to actual demands, after the first threaded member is unscrewed, rotating angles between various parts can be adjusted and then the parts are fastened, so that the solar panel can absorb solar energy at any angle, and the laser lamp can also irradiate at any angle.

6 Claims, 4 Drawing Sheets

SOLAR LASER LAMP

BACKGROUND

1. Technical Field

The present invention relates to a laser lamp, and more particularly to a solar laser lamp capable of absorbing and utilizing solar energy.

2. Related Art

Light of laser lamps has advantages such as bright color, high brightness, good directionality, far range and easy control, which seems more likely to have a magical dreamlike feeling. The laser lamps are mostly applied to buildings, parks, squares, theaters and the like, can attract eyes of people a few kilometers far away by use of non-divergence of laser beams, and thus a laser emitting point becomes the focus of people.

Solar energy is primary energy as well as renewable energy. It has abundant resources, can be used freely, does not require transportation, and has no environmental pollution. Solar power is a type of emerging renewable energy, and in the event that fossil fuels are increasingly diminishing, the solar energy has become an important part of energy used by humans and has been developed continuously.

With gradual progress of technologies of use of solar energy, a solar laser lamp that combines solar energy and a laser lamp has appeared, but in such a laser lamp, a solar panel and the laser lamp are disposed separately, that is, a solar panel assembly and a laser lamp assembly are inserted to the ground respectively by using different ground studs, and then are connected through a connecting line, and in this way, both use and transportation of the solar laser lamp are inconvenient.

SUMMARY

According to the present invention, a solar laser lamp is provided, including:

a solar panel assembly, where the solar panel assembly includes a base, a solar panel, a control circuit board and a storage battery, the solar panel, the control circuit board and the storage battery are all installed in the base, the solar panel is used for absorbing solar energy and converting the solar energy into electric energy, the storage battery is used for storing the electric energy generated by the solar panel, and the control circuit board is connected to the storage battery, to control charge and discharge of the storage battery;

a laser lamp assembly, where the laser lamp assembly includes a lamp holder and a laser lamp, and the laser lamp is installed in the lamp holder and is connected to the control circuit board; and a ground stud, where the ground stud has an installation portion on an upper end and has a spiking portion for insertion into the ground on a lower end, the base has a base connector, the lamp holder has a lamp holder connector, and the base connector, the lamp holder connector and the installation portion are fastened by using a first threaded member to pass therethrough.

The structure of the solar laser lamp provided according to the present invention enables the solar panel assembly and the laser lamp assembly to be integrally installed on the ground stud, and all parts are integrated together, to facilitate use, storage and transportation. Moreover, as the base connector, the lamp holder connector and the installation portion are fastened through the first threaded member, according to actual demands, after the first threaded member is unscrewed, rotating angles between various parts can be adjusted and then the parts are fastened, so that the solar panel can absorb solar energy at any angle, and the laser lamp can also irradiate at any angle.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

Figure 1:
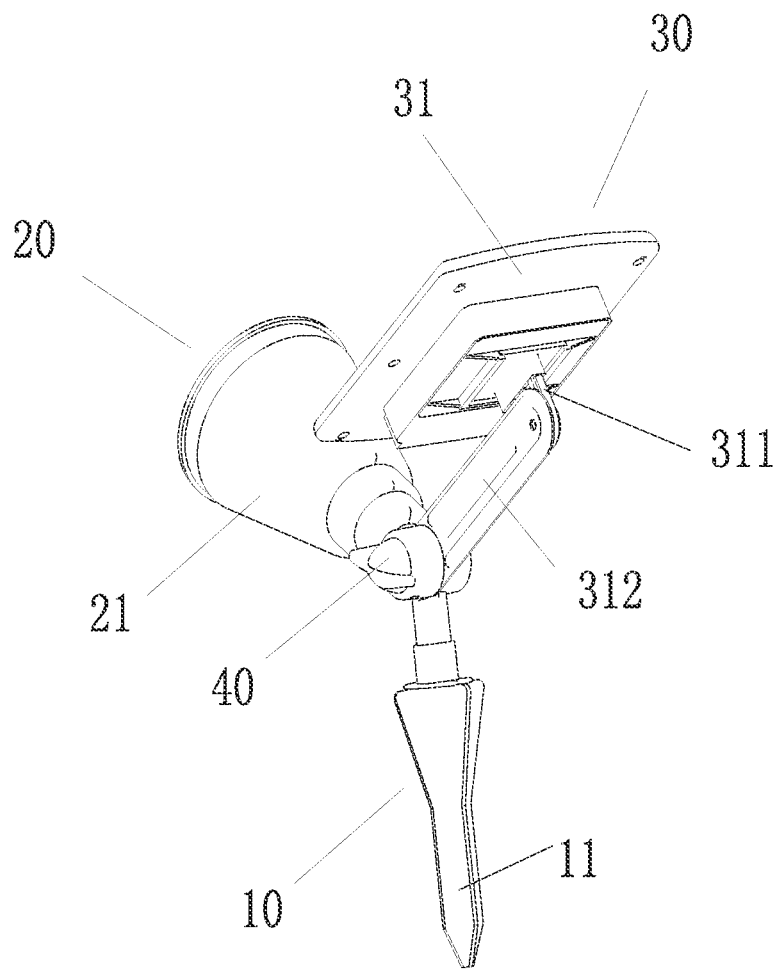
FIG. 1 is a schematic structural view of one embodiment of a solar laser lamp according to the present invention.

The present invention is further described below in detail through specific implementation manners with reference to the accompanying drawings. The present invention can be implemented in many different forms, but is not limited to the implementation manner described in the embodiment. The purpose of providing the following specific implementation manners is to facilitate clearer understanding of the content disclosed in the present invention, where terms indicating directions such as up, down, left and right are only with respect to positions of the illustrated structure in the corresponding figure.

However, persons skilled in the art may realize that one or more specific detailed descriptions therein may be omitted, or other methods, components or materials may be used. In some examples, some implementation manners are not described or not described in detail.

In addition, the features, implementation or characteristics described in the text may also be combined in any suitable manner in one or more embodiments. It is easy for persons skilled in the art to understand that steps of the method related to the embodiment provided in the text or an operation order thereof can be changed. Therefore, any order in the drawings and the embodiments is merely used for the purpose of description, but does not imply a certain order, unless a certain order is explicitly described.

Embodiment 1

Embodiment 1 provides a solar laser lamp.

Figure 2:
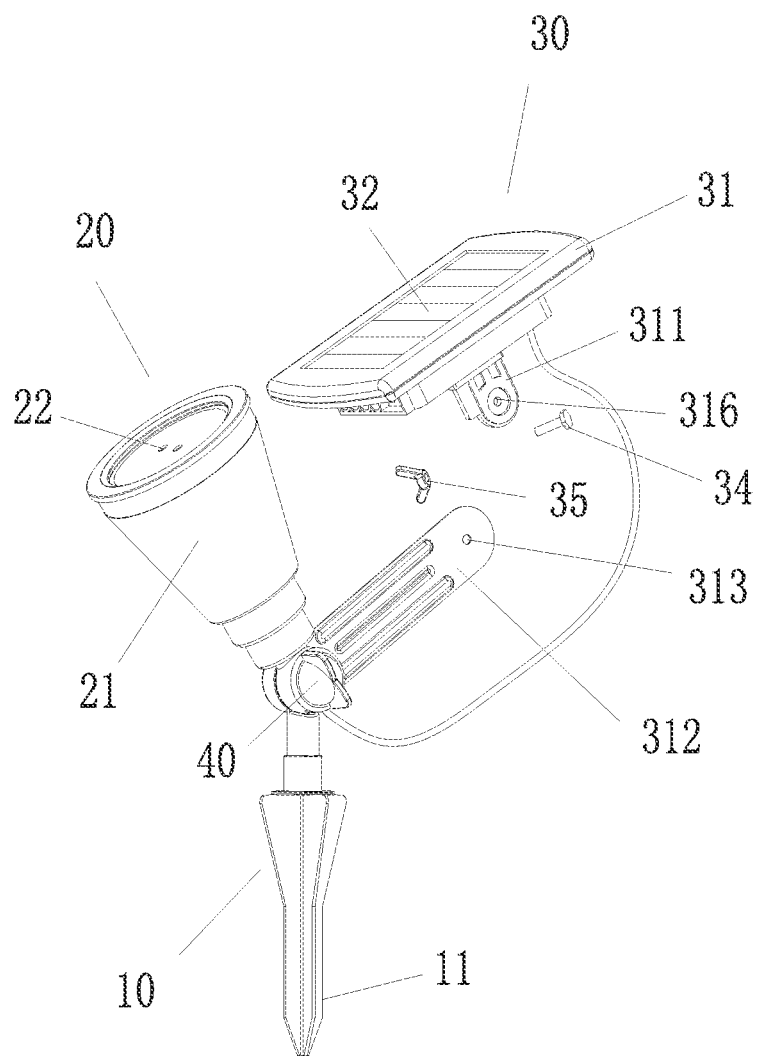
FIG. 2 is an exploded view of a base and a connecting arm in the embodiment shown in FIG. 1.
Figure 3:
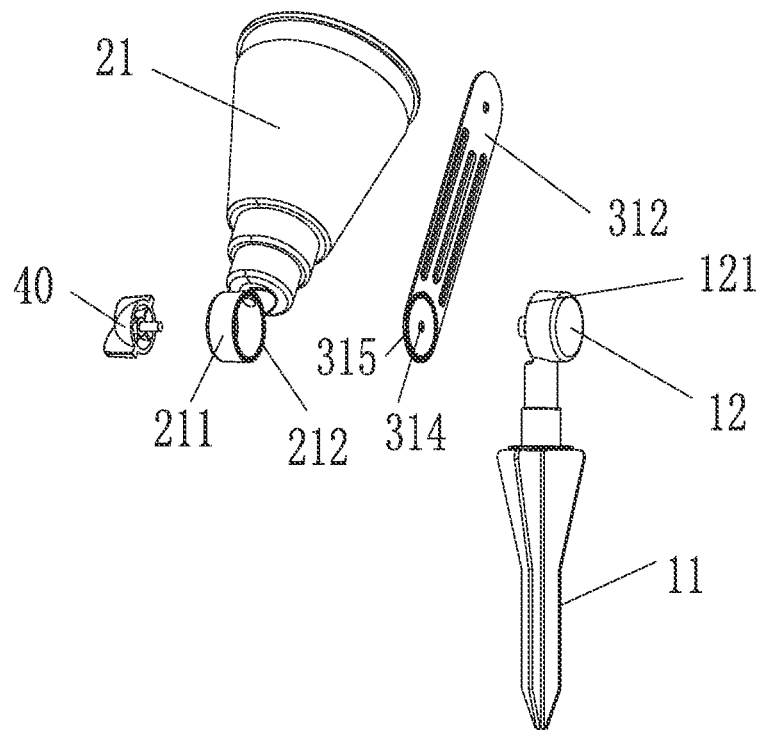
FIG. 3 is an exploded view of a laser lamp assembly, the connecting arm and a ground stud in the embodiment shown in FIG. 1.

Referring to FIG. 1 to FIG. 3, the solar laser lamp includes a ground stud 10, a laser lamp assembly 20 and a solar panel assembly 30.

The solar panel assembly 30 includes a base 31, a solar panel 32, a control circuit board and a storage battery. The control circuit board and the storage battery, in FIG. 1, are both blocked by the base 31, and both belong to more mature existing technologies, and thus are not shown in the figures.

The solar panel 32 is a unit which, by absorbing sunlight, directly or indirectly converts solar radiant energy into electric energy through photoelectric effects or photochemical effects. The solar panel 32 is a device that responds to light and can convert light energy into electric power. There are many kinds of materials that can produce photovoltaic effects, such as monocrystalline silicon, polycrystalline silicon, amorphous silicon, GaAs and CuInSe. Their power generation principles are basically the same, and the process of generating power by light is now described by taking crystalline silicon as an example.

N-type silicon can be obtained from P-type crystalline silicon through phosphorus doping, to form a P-N junction. When light irradiates a surface of the solar panel 32, a part of photons are absorbed by silicon materials. Energy of the photons is transferred to silicon atoms, so that electron transition occurs and free electrons are gathered on two sides of the P-N junction to form a potential difference, and when a circuit is turned on externally, under the action of the voltage, a current will flow through the external circuit to generate a certain output power. The process is essentially a process of converting energy of photons into electric energy.

The storage battery is also called secondary battery, that is, an electrochemical device that stores chemical energy and discharges electric energy when necessary. After discharge of the storage battery, internal active substances can be regenerated through charge, i.e., the electric energy is stored as the chemical energy; and when discharge is required, the chemical energy is converted into the electric energy once again. Such batteries are called storage battery.

The solar panel 32 is fixed onto the base 31, exposed from the base 31, and used for absorbing solar energy and converting the solar energy into electric energy. The control circuit board and the storage battery are installed in the base 31, the storage battery is used for storing the electric energy generated by the solar panel 32, and the control circuit board is connected to the storage battery, to control charge and discharge of the storage battery.

The laser lamp assembly 20 includes a lamp holder 21 and a laser lamp 22. The laser lamp 22 is installed in the lamp holder 21 and is connected to the control circuit board, and the control circuit board controls ON/OFF of the laser lamp 22. A laser module of the laser lamp 22 can emit laser which, after passing through a grating array, forms many laser points to be projected out.

Light is emitted from an atom making up a substance, the atom, after obtaining energy, is in an unstable state (that is, excited state), and it will emit the energy in a form of photons. The laser is an array of photons induced (excited), and the photons in the array of photons have the same optical properties and keep step exactly with each other. Therefore, the laser lamp has advantages such as bright color, high brightness, good directionality, far range and easy control, which seems more likely to have a magical dreamlike feeling.

The laser lamp is applied to buildings, parks, squares, theaters and the like, can attract eyes of people a few kilometers far away by use of non-divergence of laser beams, and thus a laser emitting point becomes the focus of people.

The control circuit board can be used for: 1. controlling ON/OFF of a product; 2. when the solar panel 32 generates a current, connecting the current to the storage battery to charge the storage battery and cutting off a line between the battery and the laser lamp 22, to keep the laser lamp 22 in an off state; and 3. when the solar panel 32 generates no current, switching on the line between the charged battery and the laser lamp 22.

Referring to FIG. 1 to FIG. 3 continuously, the ground stud 10 has a spiking portion 11 for insertion into the ground on a lower end, and a cross section of the spiking portion 11 may be crossed. The ground stud 10 has an installation portion 12 on an upper end, and the installation portion 12 is used for linking the base 31 and the lamp holder 21, to enable the ground stud 10, the base 31 and the lamp holder 21 to be integrated together. The base 31 has a base connector (311, 312). the lamp holder 21 has a lamp holder connector 211, and the base connector, the lamp holder connector and the installation portion are fastened by using a first threaded member 40 to pass therethrough.

Figure 5:
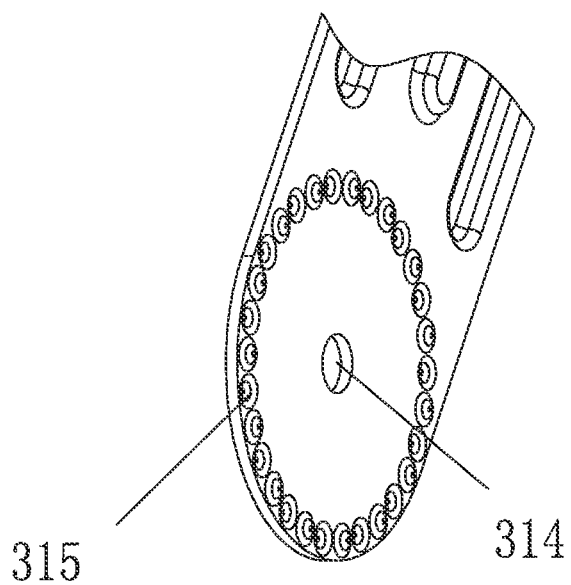
FIG. 5 is an enlarged view of one end of the connecting arm in the structure shown in FIG. 3.

Referring to FIG. 1, FIG. 2 and FIG. 5, the base connector includes a base foot 311 and a connecting arm 312, one end of the connecting arm 312 and the base foot 311 are fastened through a second threaded member 34, and the other end is linked to the lamp holder connector 211 and the installation portion 12.

That one end of the connecting arm 312 and the base foot 311 are fastened through a second threaded member 34 may be, as shown in FIG. 2, that the connecting arm 312 and the base foot 311 are both provided with through holes 313 and 316 and the second threaded member 34 passes through both of the two parts to be screwed to a mating nut 35, where the mating nut 35 may be a wing nut. Alternatively, in other embodiments, it may also be that the second threaded member 34 passes through one part therein and then is directly screwed to the other part. Such a screwed structure enables the base foot 311 to be adjustable relative to the connecting arm 312. and can implement adjustment on the direction of the solar panel 32.

Certainly, in other embodiments, the base connector may also only be the base foot 311. and the base 31 is linked to the lamp holder connector 211 and the installation portion 12 through the base foot 311. In this embodiment, the first threaded member 40 passes through the connecting arm 312 in the base connector, and certainly, in the event that the base connector is only the base foot 311, the first threaded member 40 passes through the base foot 311.

In the structure described in this embodiment that the base connector, the lamp holder connector and the installation portion are fastened by using a first threaded member to pass therethrough, the connecting arm 312, the lamp holder connector 211 and the installation portion 12 can be stacked in any order, and the first threaded member 40 can pass through any two parts therein and then is directly screwed to the third part. For example, as shown in FIG. 3, the connecting arm 312 is located between the lamp holder connector 211 and the installation portion 12, the installation portion 12 has a threaded hole thereon, the connecting arm 312 has a through hole 314 thereon, the lamp holder connector 211 also has a through hole (the through hole is blocked, and thus is not shown) thereon, and the first threaded member 40 passes through the lamp holder connector 211 and the connecting arm 312 to be fastened with the installation portion 12. In addition, in other embodiments, the first threaded member 40 may also pass through all of the three parts to be screwed to a mating nut, for example, the mating nut may be a wing nut.

As the connecting arm 312, the lamp holder connector 211 and the installation portion 12 are fastened through the first threaded member 40, according to actual demands, after the first threaded member 40 is unscrewed, rotating angles between various parts can be adjusted and then the parts are fastened, so that the solar panel 32 can absorb solar energy at any angle, and the laser lamp 22 can also irradiate at any angle.

Figure 4:
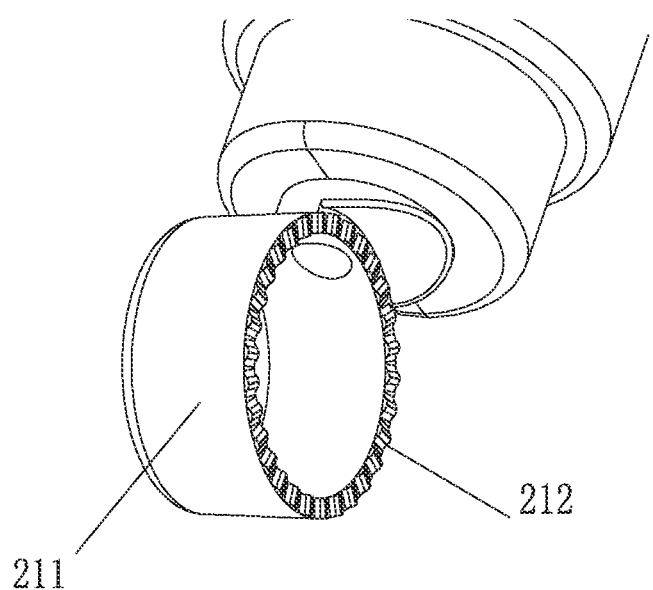
FIG. 4 is an enlarged view of a lamp holder connector in a structure shown in FIG. 3.

Further, referring to FIG. 3 to FIG. 5, in order to improve positioning effects, in this embodiment, sides where the lamp holder connector 211 and the installation portion 12 face the connecting arm 312 are respectively provided with dentiform limit projections 212 and 121. As shown in FIG. 4, in this embodiment, the limit projections 212 on the lamp holder connector 211 and the limit projections 121 on the installation portion 12 have the same structure, and thus only the limit projections 212 on the lamp holder connector 211 are enlarged and illustrated herein. One side where the connecting arm 312 faces either of the lamp holder connector 211 and the installation portion 12 is provided with limit grooves matching the limit projections in shape, as shown in FIG. 5, in this embodiment, the limit grooves on two sides of the connecting arm 312 are the same, and thus only the limit grooves 315 on one side of the connecting arm 312 are illustrated.

Certainly, in other embodiments, transformation may also be made, for example, one side where either of the lamp holder connector 211 and the installation portion 12 faces the connecting arm 312 is provided with limit grooves, and one side where the connecting arm 312 faces either of the lamp holder connector 211 and the installation portion 12 is provided with limit projections.

The matching between the grooves and the projections enables better positioning between the connecting arm 312, the lamp holder connector 211 and the installation portion 12, to prevent relative rotation between the parts.

In this embodiment, the solar panel assembly and the laser lamp assembly can be integrally installed on the ground stud, and all parts are integrated together, to facilitate use, storage and transportation. Moreover, as the base connector, the lamp holder connector and the installation portion are fastened through the first threaded member, according to actual demands, after the first threaded member is unscrewed, rotating angles between various parts can be adjusted and then the parts are fastened, so that the solar panel can absorb solar energy at any angle, and the laser lamp can also irradiate at any angle.

The above are further detailed descriptions about the present invention with reference to specific implementation manners, but it cannot be concluded that specific implementation of the present invention is merely limited to such descriptions. Persons of ordinary skill in the art also can make several simple deductions or replacements without departing from the concept of the present invention.

What is claimed is:

1. A solar laser lamp, characterized by comprising:
   a solar panel assembly, wherein the solar panel assembly comprises a base, a solar panel, a control circuit board and a storage battery, the solar panel, the control circuit board and the storage battery are all installed in the base, the solar panel is used for absorbing solar energy and converting the solar energy into electric energy, the storage battery is used for storing the electric energy generated by the solar panel, and the control circuit board is connected to the storage battery, to control charge and discharge of the storage battery;
   a laser lamp assembly, wherein the laser lamp assembly comprises a lamp holder and a laser lamp, and the laser lamp is installed in the lamp holder and is connected to the control circuit board; and
   a ground stud, wherein the ground stud has an installation portion on an upper end and has a spiking portion for insertion into the ground on a lower end, the base has a base connector, the lamp holder has a lamp holder connector, and the base connector, the lamp holder connector and the installation portion are fastened by using a first threaded member to pass therethrough.

2. The solar laser lamp according to claim 1, characterized in that, the base connector comprises a base foot and a connecting arm, one end of the connecting arm and the base foot are fastened through a second threaded member, and the other end is linked to the lamp holder connector and the installation portion.

3. The solar laser lamp according to claim 2, characterized in that, the connecting arm is located between the lamp holder connector and the installation portion, the installation portion has a threaded hole thereon, and the first threaded member passes through the lamp holder connector and the connecting arm to be fastened with the installation portion.

4. The solar laser lamp according to claim 3, characterized in that, one side where either of the lamp holder connector and the installation portion faces the connecting arm is provided with curved limit projections, and one side where the connecting arm faces either of the lamp holder connector and the installation portion is provided with curved limit grooves.

5. The solar laser lamp according to claim 3, characterized in that, one side where either of the lamp holder connector and the installation portion faces the connecting arm is provided with curved limit grooves, and one side where the connecting arm faces either of the lamp holder connector and the installation portion is provided with curved limit projections.

6. The solar laser lamp according to claim 1, characterized in that, a cross section of the spiking portion is crossed.

* * * * *